(12) United States Patent
Kadowaki et al.

(10) Patent No.: US 12,433,066 B2
(45) Date of Patent: Sep. 30, 2025

(54) SEMICONDUCTOR OPTICAL DEVICE AND METHOD OF PRODUCING THE SAME

(71) Applicant: DOWA Electronics Materials Co., Ltd., Tokyo (JP)

(72) Inventors: Yoshitaka Kadowaki, Akita (JP); Osamu Tanaka, Akita (JP)

(73) Assignee: DOWA Electronics Materials Co., Ltd., Tokyo (JP)

( * ) Notice: Subject to any disclaimer, the term of this patent is extended or adjusted under 35 U.S.C. 154(b) by 953 days.

(21) Appl. No.: 17/596,587

(22) PCT Filed: Jun. 16, 2020

(86) PCT No.: PCT/JP2020/023653
§ 371 (c)(1),
(2) Date: Aug. 8, 2022

(87) PCT Pub. No.: WO2020/255976
PCT Pub. Date: Dec. 24, 2020

(65) Prior Publication Data
US 2022/0367749 A1  Nov. 17, 2022

(30) Foreign Application Priority Data
Jun. 21, 2019  (JP) .................. 2019-115631

(51) Int. Cl.
*H10H 20/01* (2025.01)
*H10H 20/812* (2025.01)
*H10H 20/824* (2025.01)

(52) U.S. Cl.
CPC ........ *H10H 20/013* (2025.01); *H10H 20/018* (2025.01); *H10H 20/812* (2025.01); *H10H 20/824* (2025.01)

(58) Field of Classification Search
CPC .. H10H 20/013; H10H 20/824; H10H 20/812; H10H 20/018
See application file for complete search history.

(56) References Cited

U.S. PATENT DOCUMENTS

| | | | |
|---|---|---|---|
| 5,625,635 A * | 4/1997 | Kurtz | H01S 5/343 372/45.011 |
| 5,995,529 A | 11/1999 | Kurtz et al. | |
| 2019/0207055 A1* | 7/2019 | Yamamoto | H10H 20/013 |

FOREIGN PATENT DOCUMENTS

| CN | 101127383 A | 2/2008 |
|---|---|---|
| JP | H077219 A | 1/1995 |
| JP | H10505948 A | 6/1998 |
| JP | 2002075958 A | 3/2002 |
| JP | 2010161198 A | 7/2010 |
| JP | 2010238999 A | 10/2010 |

(Continued)

OTHER PUBLICATIONS

Apr. 6, 2021, Decision of Refusal issued by the Japan Patent Office in the corresponding Japanese Patent Application No. 2019-115631.

(Continued)

*Primary Examiner* — Joshua Benitez Rosario
*Assistant Examiner* — Christopher A Culbert
(74) *Attorney, Agent, or Firm* — KENJA IP LAW PC

(57) ABSTRACT

Provided is a method of producing a semiconductor optical device that makes it possible to improve the optical device properties of the semiconductor optical device including semiconductor layers containing at least In, As, and Sb. The method has a first step of forming an etching stop layer on an InAs growth substrate; a second step of forming a semiconductor laminate; a third step of forming a distribution portion; a fourth step of bonding the semiconductor laminate and the distribution portion to a support substrate with a metal bonding layer therebetween; and a fifth step of removing the InAs growth substrate.

6 Claims, 10 Drawing Sheets

(56) References Cited

FOREIGN PATENT DOCUMENTS

| | | | |
|---|---|---|---|
| JP | 2012191130 A | | 10/2012 |
| JP | 2012256826 A | | 12/2012 |
| JP | 2015534270 A | | 11/2015 |
| JP | 2018006495 A | | 1/2018 |
| JP | 2019057639 A | * | 4/2019 |
| KR | 101633871 B1 | | 6/2016 |
| WO | 2018116995 A1 | | 6/2018 |

OTHER PUBLICATIONS

Jul. 21, 2021, Office Action issued by the Taiwan Intellectual Property Office in the corresponding Taiwanese Patent Application No. 109120631.

Mar. 16, 2021, Office Action issued by the Taiwan Intellectual Property Office in the corresponding Taiwanese Patent Application No. 109120631.

Sep. 8, 2020, International Search Report issued in the International Patent Application No. PCT/JP2020/023653.

Sep. 8, 2020, Notification of Reasons for Refusal issued by the Japan Patent Office in the corresponding Japanese Patent Application No. 2019-115631.

May 10, 2022, Notification of Reasons for Refusal issued by the Japan Patent Office in the corresponding Japanese Patent Application No. 2021-092439.

Dec. 13, 2024, Office Action issued by the China National Intellectual Property Administration in the corresponding Chinese Patent Application No. 202080039758.X.

Dec. 21, 2021, International Preliminary Report on Patentability issued in the International Patent Application No. PCT/JP2020/023653.

* cited by examiner

SEMICONDUCTOR OPTICAL DEVICE AND METHOD OF PRODUCING THE SAME

TECHNICAL FIELD

This disclosure relates to a method of producing a semiconductor optical device and a semiconductor optical device.

BACKGROUND

Conventionally, semiconductor optical devices which emit or receive light in the mid-infrared region, such as mid-infrared emission semiconductor light-emitting diodes which emit light with a wavelength of 1700 nm or more in the mid-infrared region, and mid-infrared range semiconductor light-receiving elements which detect light with wavelengths in the mid-infrared region are known. For example, mid-infrared emission semiconductor light-emitting diodes are widely used in the applications such as sensors and gas analysis.

When the reception or emission wavelengths of such a semiconductor optical device are 1.7 μm to 12 μm in the mid-infrared region, typically, a substrate made of a compound such as GaAs, InP, InAs, GaSb, or InSb that are given in descending order of their lattice constant is used as a grow growth substrate, and a combination of mixed crystals of those compounds is epitaxially grown on the growth substrate. Of substrates of those compounds, InAs, GaSb, and InSb compound substrates have a lattice constant approximate to that of light emitting layers for the mid-infrared region of 1.7 μm to 12 μm. Accordingly, it has been considered that InAs, GaSb, or InSb would be preferably used for a growth substrate of a semiconductor optical device for the mid-infrared region.

For example, in JP 2015-534270 A (PTL 1), for example, after an InSbP layer is formed on an InAs substrate, an InAsSbP active layer is formed. In PTL 1, a conductive InAs substrate is used as is for wavelengths of 2.6 μm to 4.7 μm in a light-emitting diode.

Further, JP 2012-256826 A (PTL 2) discloses a light-receiving element obtained by forming a GaSb layer and an InGaAsSb-based multiple quantum well layer on an InP substrate. PTL 2 also describes that the GaSb layer absorbs light under the influence of free carriers, and the InP substrate is transparent to light with a wavelength of 3 μm to 12 μm.

Further, JP 2010-238999 A (PTL 3) discloses a serial connection optical device with an operating wavelength of 1 μm or more that is formed on a growth semiconducting GaAs substrate.

CITATION LIST

Patent Literature

PTL 1: JP 2015-534270 A
PTL 2: JP 2012-256826 A
PTL 3: JP 2010-238999 A

SUMMARY

Technical Problem

In recent years, semiconductor optical devices are required to have further improved properties such as improved efficiency of light-emitting diodes and improved sensitivity of light-receiving elements. In each of the techniques described in PTLs 1 to 3, a growth substrate is used as is as a support substrate of a semiconductor optical device. However, in this case, it is difficult to use a technique of improving the properties of a semiconductor optical device by providing a distribution portion including insulating materials and conductive materials between a support substrate and a semiconductor layer. To address this, the inventors of this disclosure have made attempts to use a technique of providing a distribution portion on a semiconductor laminate formed by epitaxial growth on a growth substrate; bonding the semiconductor laminate and the distribution portion to a support substrate different from the growth substrate; and then removing the growth substrate (hereinafter, "bonding process"). To manufacture semiconductor optical devices with an operating wavelength in the mid-infrared region, InAsSbP-based III-V compound semiconductors including at least In, As, and Sb are typically epitaxially grown on a growth substrate. When an InAsSbP-based III-V compound semiconductor containing at least Sb is used, using an InP substrate or a GaAs substrate as a growth substrate as in PTLs 2 and 3 is one option. However, considering the difference in lattice constant from the semiconductor layer formed on the growth substrate, the crystallinity of the semiconductor layer would be lower when these growth substrates are used. This being the case, the inventors conceived of using an InAs substrate as a growth substrate. However, when an InAs substrate is used as a growth substrate and the bonding process is used to form a distribution portion on a semiconductor laminate, where the InAs substrate is necessarily removed, experiments made by the inventors demonstrated that the InAs substrate was hardly removed without etching the semiconductor laminate grown on the InAs substrate without performing excessively complicated steps as a production process. In order to improve the properties of a semiconductor optical device including at least In, As, and Sb using the bonding process to provide a distribution portion, the necessity of establishing a technique of removing an InAs substrate occurred as a new challenge to the inventors. If an InAs substrate can be appropriately removed in the bonding process, a distribution portion can be placed, thus there is a reasonable prospect in improving the properties of semiconductor optical devices including an InAsSbP-based III-V compound semiconductor.

Accordingly, it could be helpful to provide a method of producing a semiconductor optical device that makes it possible to improve the optical device properties of the semiconductor optical device including semiconductor layers containing at least In, As, and Sb. It could also be helpful to provide a semiconductor optical device produced by this production method.

Solution to Problem

The inventors diligently studied ways to address the above challenges and found an etching stop layer that makes it possible to remove an InAs growth substrate when using the bonding process, without etching a semiconductor laminate provided on the InAs growth substrate without performing excessively complicated steps as a production process. Specifically, we provide the following features.

(1) A method of producing a semiconductor optical device, comprising:

a first step of forming an etching stop layer made of GaAsSb-based III-V compound semiconductors including at least Ga and Sb on an InAs growth substrate;

a second step of forming a semiconductor laminate in which a plurality of layers made of InAsSbP-based III-V compound semiconductors including at least In and As are stacked on the etching stop layer;

a third step of forming a distribution portion including a transparent insulating layer having a through hole and an ohmic electrode portion provided in the through hole on the semiconductor laminate;

a fourth step of bonding the semiconductor laminate and the distribution portion to a support substrate with at least a metal bonding layer therebetween; and a fifth step of removing the InAs growth substrate, wherein InAsSbP-based III-V compound semiconductors of at least one of the layers in the semiconductor laminate include at least In, As, and Sb.

(2) The method of producing a semiconductor optical device, according to (1) above, wherein the GaAsSb-based III-V compound semiconductors forming the etching stop layer contains at least Ga, As, and Sb.

(3) The method of producing a semiconductor optical device, according to (1) above, wherein the etching stop layer includes a superlattice laminate, and the superlattice laminate includes layers containing Ga, As, and Sb.

(4) The method of producing a semiconductor optical device, according to any one of (1) to (3) above, wherein the semiconductor laminate includes an n-type cladding layer, an active layer, and a p-type cladding layer in this order.

(5) The method of producing a semiconductor optical device, according to (4) above, wherein the semiconductor laminate has a double heterostructure, and InAsSbP-based III-V compound semiconductors forming the active layer include at least In, As, and Sb.

(6) The method of producing a semiconductor optical device, according to (4) above, wherein the semiconductor laminate has a quantum well structure including barrier layers and well layers, and InAsSbP-based III-V compound semiconductors forming the barrier layers include at least In, As, and Sb.

(7) The method of producing a semiconductor optical device, according to any one of (1) to (6) above, wherein an operating wavelength of the semiconductor optical device is 3.4 µm or more.

(8) A semiconductor optical device comprising:

a support substrate;

a metal bonding layer provided on a surface of the support substrate;

a distribution portion including a transparent insulating layer having a through hole and an ohmic electrode portion provided in the through hole, the distribution portion being provided on the metal bonding layer; and a semiconductor laminate in which a plurality of layers made of InAsSbP-based III-V compound semiconductor including at least In and As are stacked, the semiconductor laminate being provided on the distribution portion.

(9) The semiconductor optical device according to (8) above, wherein the semiconductor laminate includes an n-type cladding layer, an active layer, and a p-type cladding layer in this order.

(10) The semiconductor optical device according to (9) above, wherein the semiconductor laminate has a double heterostructure, and InAsSbP-based III-V compound semiconductors forming the active layer include at least In, As, and Sb.

(11) The semiconductor optical device according to (9) above, wherein the semiconductor laminate has a quantum well structure including barrier layers and well layers, and InAsSbP-based III-V compound semiconductors forming the barrier layers include at least In, As, and Sb.

(12) The semiconductor optical device according to any one of (8) to (11) above, wherein an operating wavelength of the semiconductor optical device is 3.4 µm or more.

Advantageous Effect

This disclosure can provide a method of producing a semiconductor optical device that makes it possible to improve the optical device properties of the semiconductor optical device including semiconductor layers containing at least In, As, and Sb. This disclosure can also provide a semiconductor optical device produced by this production method.

DETAILED DESCRIPTION

Figure 1:
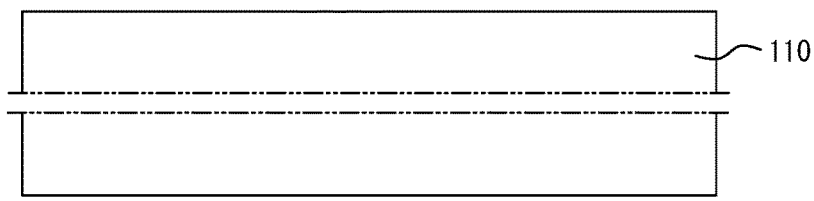
FIG. 1 is a schematic cross-sectional view illustrating one embodiment of a method of producing a semiconductor optical device according to this disclosure.

Prior to describing embodiments of this disclosure, the following aspects are described in advance.

<Composition>

First, in this specification, the expression "AlInGaAsSbP" alone for which the III-V compound composition ratio is not specified means a given compound having a chemical composition ratio of group III elements (Al, In, and Ga in total) with respect to group V elements (As, Sb, and P) of 1:1, in which the ratio between Al, In, and Ga that are group III elements and the ratio between As, Sb, and P that are group V elements are undefined. In this case, there may be a possibility that one or two elements of Al, In, and Ga are not contained as the group III elements; and there may be a possibility that one or two of As, Sb, and P are not contained as the group V elements. However, when a compound is explicitly described to "contain at least" either or both of specific group III elements and specific group V elements, the subject group III elements or group V elements are each contained at more than 0% and 100% or less. For example, AlInGaAsSbP "containing at least In and Sb" contains more than 0% and 100% or less of each of In and Sb. In this case, Al and Ga, and As and P other than In and Sb may or may not be contained. Further, an AlInGaAsSbP "-based" III-V compound semiconductor may contain a given dopant. Note that the chemical composition ratio between the group III-V elements of AlInGaAsSbP can be found for example by a photoluminescence measurement or an X-ray diffraction measurement.

On the other hand, when specific group III elements or group V elements are excluded from "AlInGaAsSbP", the subject group III elements or group V elements are not contained in the composition. For example, the composition of "InAsSbP" is represented by a general formula: $InAs_xSb_yP_z$, and does not contain Al and Ga. In this case, for the composition ratio between the elements, the following relationships hold, and the composition ratios of the group V elements is 1 in total. Meanwhile, the total of the composition ratios of the group III elements is also 1.

$$z=1-x-y, \ 0 \leq x \leq 1, \ 0 \leq y \leq 1, \ 0 \leq z \leq 1$$

<p-Type, n-Type, and i-Type; and Dopant Concentration>

In this specification, a layer serving as an electrically p-type layer is referred to as a p-type semiconductor layer (may also be simply referred to as a "p-type" layer), and a layer serving as an electrically n-type layer is referred to as an n-type semiconductor layer (may also be simply referred to as an "n-type" layer). On the other hand, a layer that is not deliberately doped with certain impurities such as Si, Zn, S, Sn, and Mg and does not serve as an electrically p-type or n-type layer is referred to as an "i-type" or "undoped" layer. An undoped III-V compound semiconductor layer may contain impurities that are unavoidably mixed in the production process. Specifically, when a layer has a low dopant concentration (for example, less than $7.6 \times 10^{15}$ atoms/cm$^3$), the layer is treated as being "undoped" in this specification. Further, the values of the impurity concentrations of Si, Sn, S, Te, Mg, Zn, etc. are determined by SIMS analysis. Note that since the value of a dopant concentration greatly varies in proximity to the boundaries between semiconductor layers, the value of the dopant concentration is found as the value of the dopant concentration at the center in the thickness direction of each layer.

<Thickness and Composition of Layers>

Further, the total thickness of the layers formed can be found by observing a cross section of the layers using a scanning electron microscope or a transmission electron microscope. Moreover, the thickness of each layer can be found by observing a cross section of the grown layer using a transmission electron microscope. When the thickness of each layer is small as in a superlattice structure, the thickness can be measured using TEM-EDS. Note that when a certain layer has an inclined surface in a cross-sectional view, the thickness of the layer is defined by the maximum height of the layer from a flat surface of the underlying layer.

Correspondences Between Drawings for Embodiments

Figure 5:
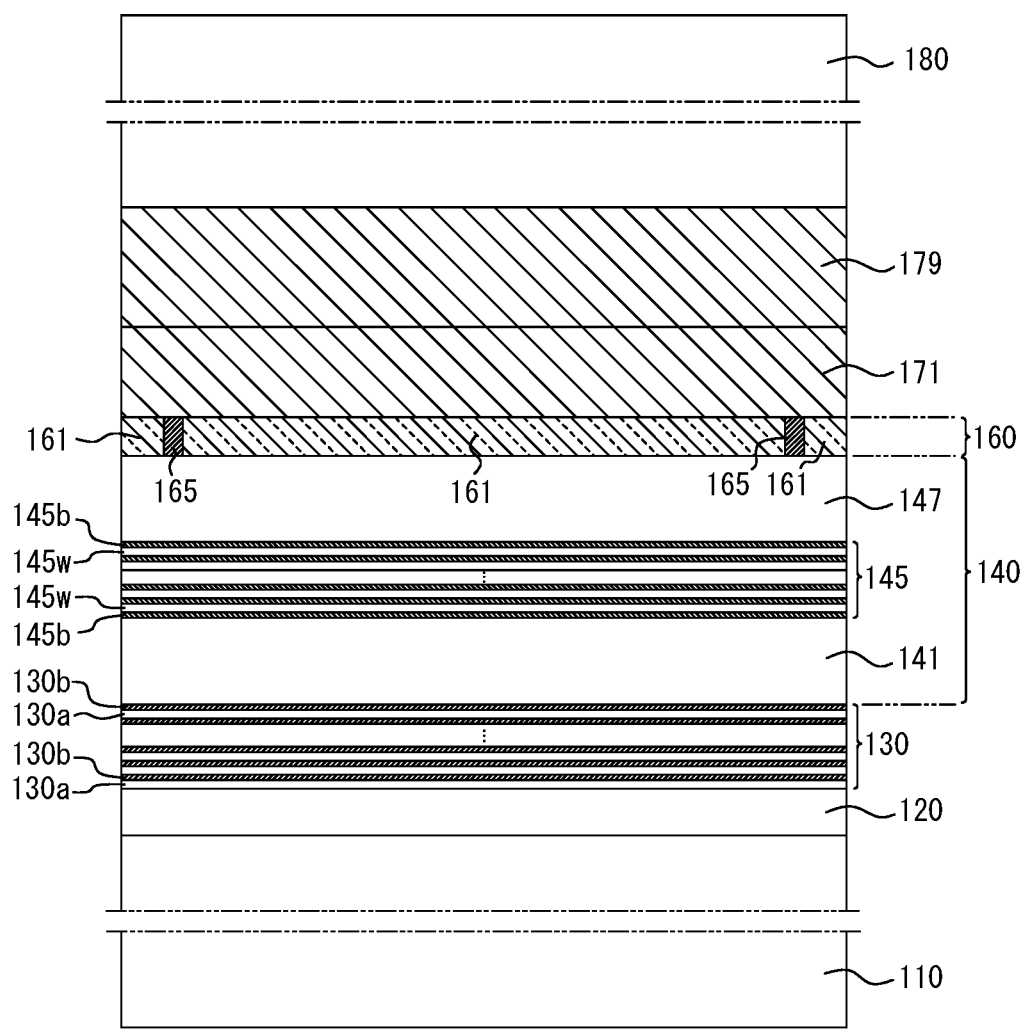
FIG. 5 is a schematic cross-sectional view illustrating the embodiment of a method of producing a semiconductor optical device according to this disclosure, subsequent to the step in FIG. 4D.
Figure 6:
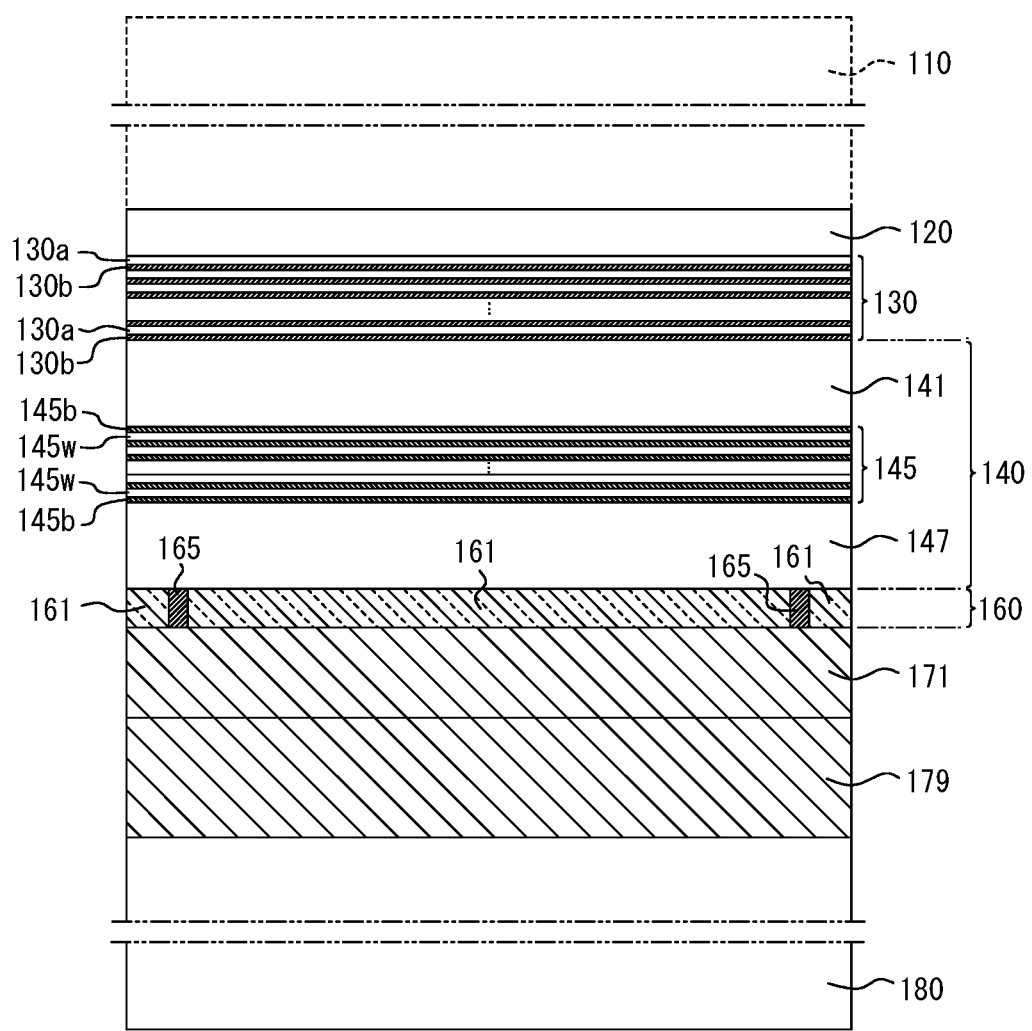
FIG. 6 is a schematic cross-sectional view illustrating the embodiment of a method of producing a semiconductor optical device according to this disclosure, subsequent to the step in FIG. 5.
Figure 7A:
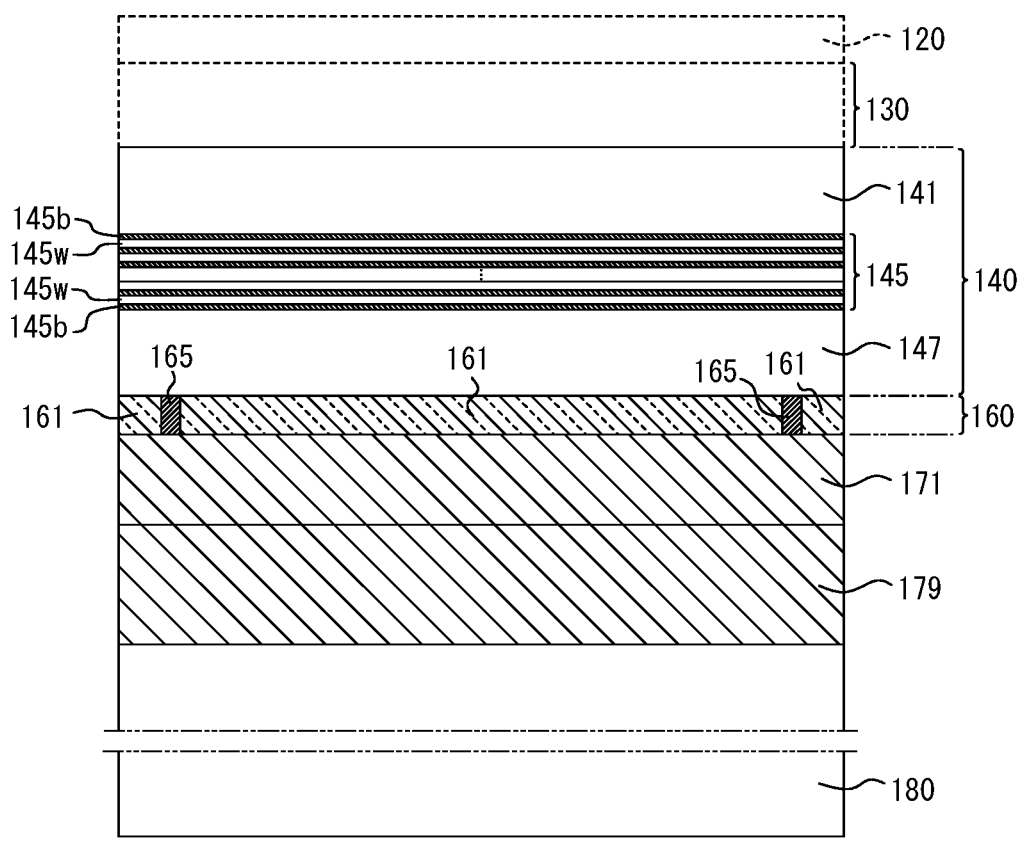
FIG. 7A is a schematic cross-sectional view illustrating the embodiment of a method of producing a semiconductor optical device according to this disclosure, subsequent to the step in FIG. 6.
Figure 7B:
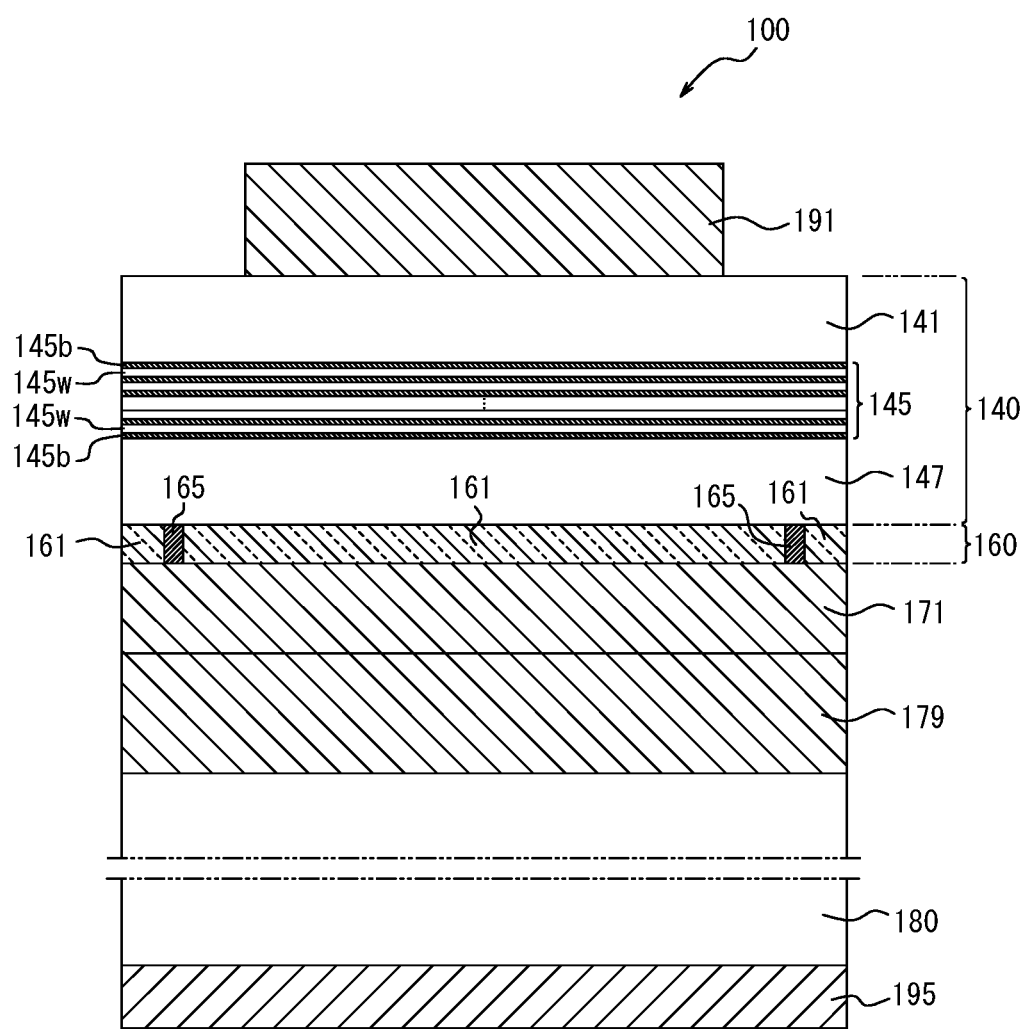
FIG. 7B is a schematic cross-sectional view illustrating an example of a semiconductor optical device obtained by the embodiment of a method of producing a semiconductor optical device according to this disclosure, subsequent to the step in FIG. 7A.
Figure 8:
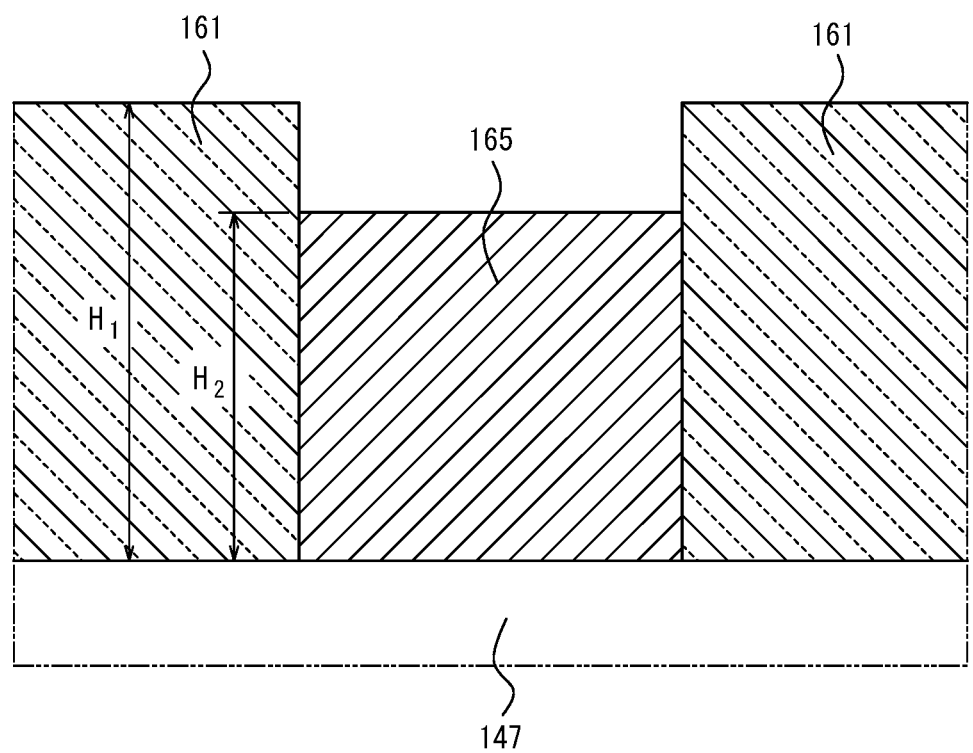
FIG. 8 is an enlarged schematic cross-sectional view illustrating a preferred aspect of a distribution portion in a method of producing a semiconductor optical device, according to this disclosure.
Figure 9:
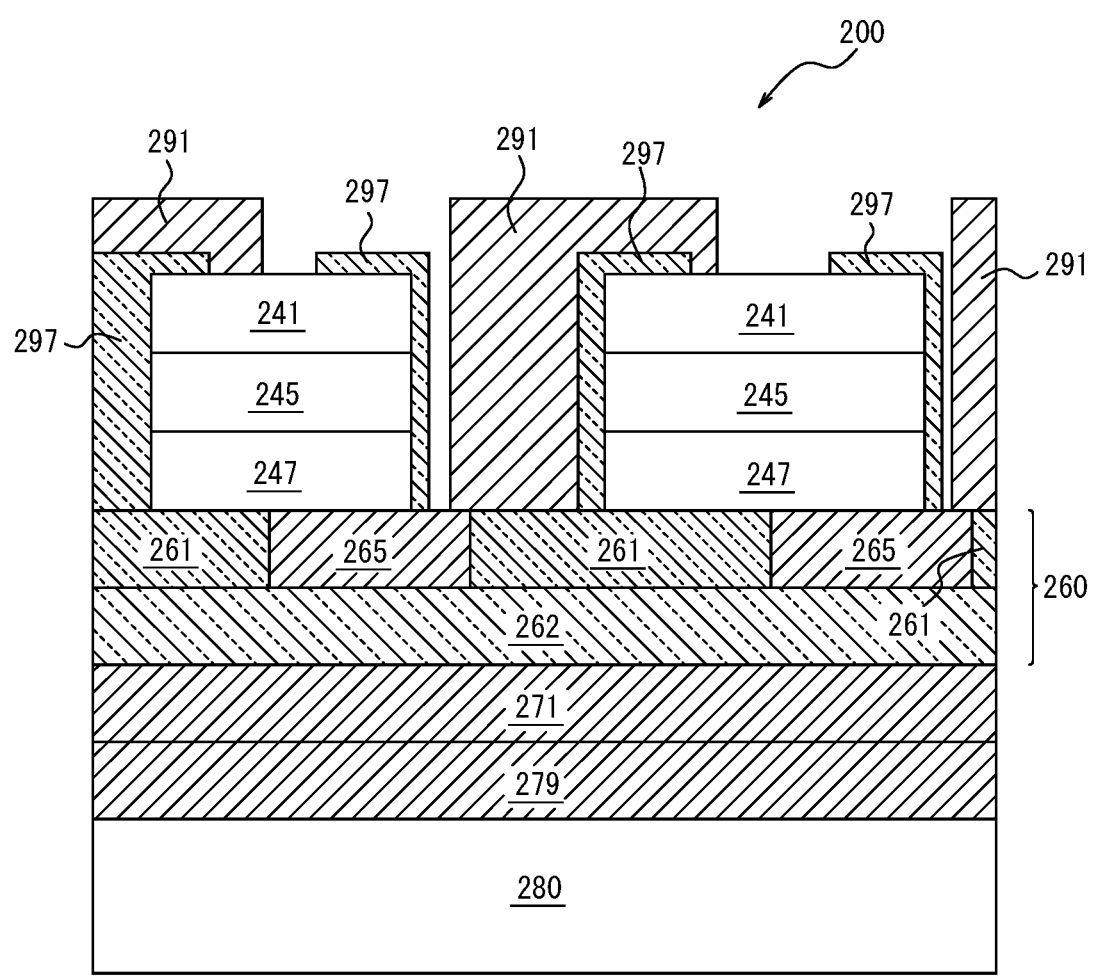
FIG. 9 is a schematic cross-sectional view illustrating another embodiment of a method of producing a semiconductor optical device according to this disclosure.

Prior to describing a semiconductor optical device according to this disclosure, the following relationships between FIG. 1 to FIG. 7B are described in advance. FIG. 1 to FIG. 7B are a series of schematic cross-sectional views illustrating the steps of one embodiment of a method of producing a semiconductor optical device 100, according to this disclosure. It should be noted that the structure depicted in FIGS. 1 to 5 is depicted upside down in FIG. 6 to FIG. 7B. Further, FIG. 8 is an enlarged view of a preferred embodiment of a distribution portion 160 in a step of forming the distribution portion 160 (corresponding to FIG. 4C). In principle, like or corresponding components are denoted by like reference numerals, and the description will not be repeated. Further, semiconductor optical devices according to this disclosure roughly fall into two embodiments: a light-emitting type and a light-receiving type. Light-emitting semiconductor optical devices further include semiconductor light-emitting diodes having a single element structure and semiconductor photo arrays having semiconductor light-emitting diodes connected in series on a substrate. The semiconductor optical device 100 in FIG. 7B is an aspect of a semiconductor light-emitting diode, and a semiconductor optical device 200 in FIG. 9 is an aspect of a semiconductor photo array. Here, a substrate and layers in each drawing are exaggerated in thickness for convenience of description, so that the ratio between the vertical and horizontal dimensions of each illustrated component does not conform to the actual ratio.

The following is a description of a method of producing a semiconductor optical device, according to this disclosure. The method of producing a semiconductor optical device, according to this disclosure includes at least a first step, a second step, a third step, a fourth step, and a fifth step to be described.

In the first step, an etching stop layer made of GaAsSb-based III-V compound semiconductors including at least Ga and Sb is formed on an InAs growth substrate. In the second step, a semiconductor laminate in which a plurality of layers made of InAsSbP-based III-V compound semiconductors including at least In and As are stacked is formed on the etching stop layer. In the third step, a distribution portion including a transparent insulating layer having through holes and ohmic electrode portions provided in the through holes are formed on the semiconductor laminate. In the fourth step, the semiconductor laminate and the distribution portion are bonded to a support substrate with at least a metal bonding layer therebetween. In the fifth step, the InAs growth substrate is removed. The InAsSbP-based III-V compound semiconductors of at least one of the layers in the semiconductor laminate contain at least In, As, and Sb.

In this disclosure, as described above, a layer made of InAsSbP-based III-V compound semiconductors including at least In, As, and Sb is epitaxially grown on the InAs growth substrate (second step), and a distribution portion is formed (third step). Further, in this disclosure, after the semiconductor laminate and the distribution portion are bonded to the support substrate different from the InAs growth substrate (fourth step), the InAs growth substrate is removed (fifth step). Accordingly, the etching stop layer made of GaAsSb-based III-V compound semiconductors including at least Ga and Sb is formed on the growth substrate (first step).

First, the production method of this disclosure will now be described in detail by describing embodiments of a method of producing the semiconductor optical device 100 as a semiconductor light-emitting diode.

Embodiment 1: Semiconductor Light-Emitting Diode

A method of producing the semiconductor optical device 100, according to Embodiment 1 of this disclosure has at least a first step (FIG. 2) of forming an etching stop layer 130 on an InAs growth substrate 110 (FIG. 1); a second step (FIG. 3) of forming a semiconductor laminate 140 on the etching stop layer 130; a third step (FIG. 4C) of forming a distribution portion 160 on the semiconductor laminate 140; a fourth step (FIG. 5) of bonding the semiconductor laminate and the distribution portion to a support substrate 180; and a fifth step (removal step) (FIG. 6) of removing the growth substrate 110. As seen in FIG. 1 to FIG. 7B, the production method may optionally has an initial buffer layer formation step (see FIG. 2), a metal reflective layer formation step (see FIG. 4D), a metal bonding layer formation step (see FIG. 5), an initial buffer layer removal step (see FIG. 7A), an etching stop layer removal step (see FIG. 7A), and an electrode formation step (see FIG. 7B). The steps, including the above optional steps, will now be described in succession.

<First Step>

Figure 2:
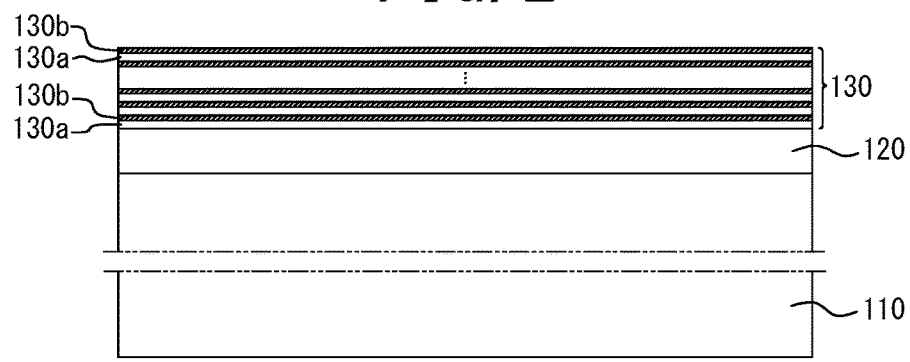
FIG. 2 is a schematic cross-sectional view illustrating the embodiment of a method of producing a semiconductor optical device according to this disclosure, subsequent to the step in FIG. 1.

Reference is made to FIG. 1 and FIG. 2. First, in the first step, the etching stop layer 130 made of GaAsSb-based III-V compound semiconductors including at least Ga and Sb is formed on the InAs growth substrate 110. The etching stop layer 130 is made of GaAsSb-based III-V compound semiconductors including at least Ga and Sb. Prior to the first step, the subject production method may further include the initial buffer layer formation step of forming an initial buffer layer 120 on a surface of the InAs growth substrate 110. In this case, the etching stop layer 130 is formed on the initial buffer layer 120.

«InAs Growth Substrate»

The InAs growth substrate 110 may use any one of an n-type InAs substrate, an undoped InAs substrate, and a p-type InAs substrate, which are commercially available.

«Etching Stop Layer»

The etching stop layer 130 is a semiconductor layer that displays a sufficiently low etch rate in an etchant (for example, concentrated hydrochloric acid having a concentration of 8 M (mol/L) or more, to be described in detail for the fifth step) used in etching the InAs growth substrate 110, and is insoluble in the etchant until the InAs growth substrate is completely removed. Further, the etching stop layer 130 has a lattice constant such that it can be grown on the InAs growth substrate 110.

—Composition of Etching Stop Layer—

The composition of the GaAsSb-based III-V compound semiconductors of the etching stop layer 130 is expressed as $GaAs_{xE}Sb_{1-xE}$, where the As composition ratio is $x_{ESL}$. Here, the As composition ratio $x_E$ preferably satisfies $0 \leq x_E \leq 0.4$. An As composition ratio $x_E$ of more than 0.4 would allow etching even in the etchant mentioned above, and an As composition ratio $x_E$ satisfying this range allows the etching stop layer 130 to be epitaxially grown on the InAs growth substrate 110 with the etching stop layer 130 being insoluble in the above etchant. It is also preferred that the GaAsSb-based III-V compound semiconductors contain at least Ga, As, and Sb. Specifically, the As composition ratio $x_E$ more preferably satisfies $0 < x_E$, still more preferably satisfy $0.02 \leq x_E \leq 0.13$. An As composition ratio $x_E$ within this range can reduce the difference in lattice contact from the InAs growth substrate.

—Layer Structure of Etching Stop Layer—

Note that the etching stop layer 130 may have a single layer structure or may have a layered structure including a plurality of layers. It is also preferred that the etching stop layer 130 includes a superlattice laminate and the superlattice laminate includes layers containing Ga, As, and Sb. In FIG. 2, the etching stop layer 130 has a superlattice laminate in which first layers 130a and second layers 130b are alternately stacked in this order. For example, even if a composition lattice matched with a growth substrate is hardly grown as a single layer, a superlattice structure having layers with a composition having a larger lattice constant than the growth substrate and a composition having a smaller lattice constant than the growth substrate each with the thickness equal to or less than the critical thickness can compensate strain. When the lattice constant of the average composition of the whole etching stop layer of the superlattice structure is made closer to the lattice constant of the growth substrate, an etching stop layer having good crystallinity and a sufficient thickness can be obtained. Further, when the chemical composition of the first layer 130a is expressed as $GaAs_{xE1}Sb_{1-xE1}$, $0.08 \leq x_{E1} \leq 0.80$ is acceptable, and $0.10 \leq x_{E1} \leq 0.40$ is preferable. Meanwhile, when the chemical composition of the second layer 130b is expressed as $GaAs_{xE2}Sb_{1-xE2}$, $0 \leq x_{E2} \leq 0.08$ is acceptable, and $0 \leq x_{E2} \leq 0.05$ is preferable. Where the thickness of the first layer 130a is expressed as $t_1$ and the thickness of the second layer 130b is expressed as $t_2$, the average composition ratio $x_{E3}$ can be represented by $(x_{E1} \times t_1 + x_{E2} \times t_2)/(t_1+t_2)$. The average composition ratio $x_{E3}$ satisfies $0 \leq x_{E3} \leq 0.4$, preferably satisfies $0.02 \leq x_{E3} \leq 0.13$.

—Thickness of Etching Stop Layer—

The total thickness of the etching stop layer 130 may be for example, but not limited to, 10 nm to 200 nm. When the etching stop layer 130 includes a superlattice laminate, the thickness of each layer in the laminate may be set to 0.05 nm to 10.0 nm, and the number of sets of the two different layers can be set to 10 to 200.

—Initial Buffer Layer—

As described above, the initial buffer layer 120 may be formed on the surface of the InAs growth substrate 110. This can prevent the influence of an oxide film, contamination, etc. on the substrate surface of the InAs growth substrate 110 when the etching stop layer 130 is formed directly on the InAs growth substrate 110. When an initial buffer layer made of InAs is grown, purification of the interface between the etching stop layer 130 and the initial buffer layer 120 can be expected. This is expected to result in the effect of improving the crystallinity of semiconductor layers to be epitaxially grown and stabilizing the surface exposed by removing the growth substrate.

—Growth Method—

The semiconductor layers can be formed by epitaxial growth, for example by a known thin film deposition technique such as metalorganic chemical vapor deposition (MOCVD), molecular beam epitaxy (MBE), or sputtering. For example, trimethylindium (TMIn) may be used as an In source, trimethylgallium (TMGa) or triethylgallium (TEGa) as a Ga source, arsine ($AsH_3$) or tertiary butyl arsine (TBAs) as an As source, trimethylantimony (TMSb), triethylantimony (TESb), or trisdimethylaminoantimony (TDMASb) as a Sb source, and phosphine ($PH_3$) or tertiary butylphosphine (TBP) as a P source at a predetermined mixing ratio, and these source gases may be subjected to vapor phase epitaxy using a carrier gas to form an InGaAsSbP layer having a desired thickness by controlling the growth time. Note that other InGaAsP and GaAsSb to be epitaxially grown may be formed in a similar manner. When the layers are p-type or n-type doped, a dopant source gas as desired can be used in addition. The same applies to the second step.

<Second Step>

Figure 3:
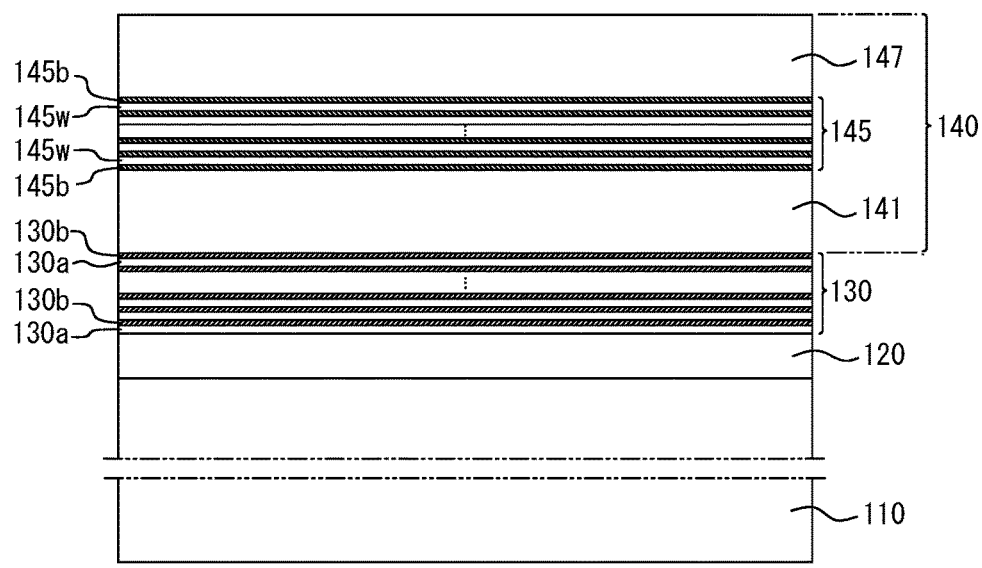
FIG. 3 is a schematic cross-sectional view illustrating the embodiment of a method of producing a semiconductor optical device according to this disclosure, subsequent to the step in FIG. 2.

Reference is made to FIG. 3. In the second step, the semiconductor laminate 140 in which a plurality of layers made of InAsSbP-based III-V compound semiconductors including at least In and As are stacked is formed on the etching stop layer 130. The semiconductor laminate 140 in this embodiment includes an n-type cladding layer 141, an active layer 145, and a p-type cladding layer 147 in this order. As long as the active layer is formed between the p-type cladding layer and the n-type cladding layer, whichever of the p-type cladding layer and the n-type cladding layer may be formed first. The following is a description of an aspect of sequentially forming an active layer 145 and a p-type cladding layer 147 on the n-type cladding layer 141 as in FIG. 3.

«Semiconductor Laminate»

The semiconductor laminate 140 may have a double hetero (DH) structure in which the active layer 145 is sandwiched between the n-type cladding layer 141 and the p-type cladding layer 147. In this case, the InAsSbP-based III-V compound semiconductors forming the active layer 145 preferably include In, As, and Sb. It is also preferred that the active layer 145 has a multiple quantum well (MQW) structure in order to improve light output by reducing crystal defects. The active layer 145 having a multiple quantum-well structure can be formed by alternately repeating well layers 145W and barrier layers 145B. The well layers 145w may be made of InAsSb containing at least In, As, and Sb. Meanwhile, the barrier layers 145b may be made of InAsSbP having a larger band gap than the well layers 145w. The semiconductor laminate 140 as described above allows the semiconductor optical device 100 to emit light having a wavelength in a desired mid-infrared region.

—Operating Wavelength (Emission Wavelength)—

For example, changing the composition of the active layer 145 allows the semiconductor optical device 100 to have an emission peak wavelength of 1700 nm to 12000 nm (1.7 μm to 12 μm). The operating wavelength (emission wavelength) of the semiconductor optical device 100 may be 3.1 μm or more, preferably 3.4 μm or more. In PTL 1 cited above, where an InAs substrate that is a growth substrate is used as is as a support substrate, InAs absorbs part of mid-infrared light having wavelengths less than 3.4 μm, and still absorbs some light with wavelengths of 3.4 μm or more. In this embodiment, since the InAs growth substrate 110 is removed, there is no concern light emitted from such an active layer would be absorbed by the InAs substrate, resulting in significantly advantageous optical device properties of the semiconductor optical device.

—Composition of Active Layer—

Further, when the chemical composition of the well layers 145w is expressed as $InAs_{xw}Sb_{1-xw}$, $0.7 \leq xw \leq 1.0$ is acceptable, and $0.8 \leq xw \leq 1.0$ is preferable. Meanwhile, when the chemical composition of the barrier layers 145b is expressed as $InAs_{xb}P_{1-xb}$, $0.5 \leq xb \leq 1$ is acceptable, and $0.8 \leq xb \leq 1$ is preferable. In the case of a quantum well structure, in addition to changing the composition of the InAsP-based III-V compound, adjusting the difference between the composition ratios between the well layers 145w and the barrier layers 145b to add strain in the well layers is also preferred.

—Composition of Cladding Layer—

The n-type cladding layer 141 and the p-type cladding layer 147 are preferably layers made of InAsP-based III-V compound semiconductors including at least In and As. The n-type cladding layer 141 and p-type cladding layer 147 that do not contain Ga ensure the prevention of etching of the cladding layers when the etching stop layer 130 is removed. Further, n-type InAs is particularly preferably used for the n-type cladding layer 141, and p-type InAs is particularly preferably used for the p-type cladding layer 147.

—Thickness of Semiconductor Laminate—

The total thickness of the semiconductor laminate 140 may be for example, but not limited to, 2 μm to 8 μm. Similarly, the thickness of the n-type cladding layer 141 may be for example, but not limited to, 0.5 μm to 5 μm. Further, the thickness of the active layer 145 may be for example, but not limited to, 3 nm to 1000 nm. Similarly, the thickness of the p-type cladding layer 147 may be for example, but not limited to, 0.1 μm to 3 μm. When the active layer 145 has a quantum well structure, the thickness of the well layers 145W may be 3 nm to 20 nm, and the thickness of the barrier layers 145B may be 5 nm to 50 nm. The number of sets of the two layers may be 1 to 50.5. Note that it is also preferred that a barrier layer 145b is first formed, and N sets (N is an integer) of well layers 145w and barrier layers 145b (thickness: 8 nm) are then stacked in an alternate manner to form N.5 sets in total. In this case, both ends of the quantum well structure are barrier layers 145b.

—Other Semiconductor Layers in Semiconductor Laminate—

Although not illustrated in the diagrams, it is also preferred that the semiconductor laminate 140 further has contact layers having a higher dopant concentration than the cladding layers separately on the n-type cladding layer 141 and the p-type cladding layer 147 on the side opposite to the active layer 145 (that is, the side where electrodes are to be described are formed). Further, the semiconductor laminate 140 may include i-type spacers separately between the n-type cladding layer 141 and the active layer 145, the active layer 145 and the p-type cladding layer 147. Further, a p-type electron blocking layer may be provided between the active layer 145 and the p-type cladding layer 147.

<Third Step>

Figure 4A:
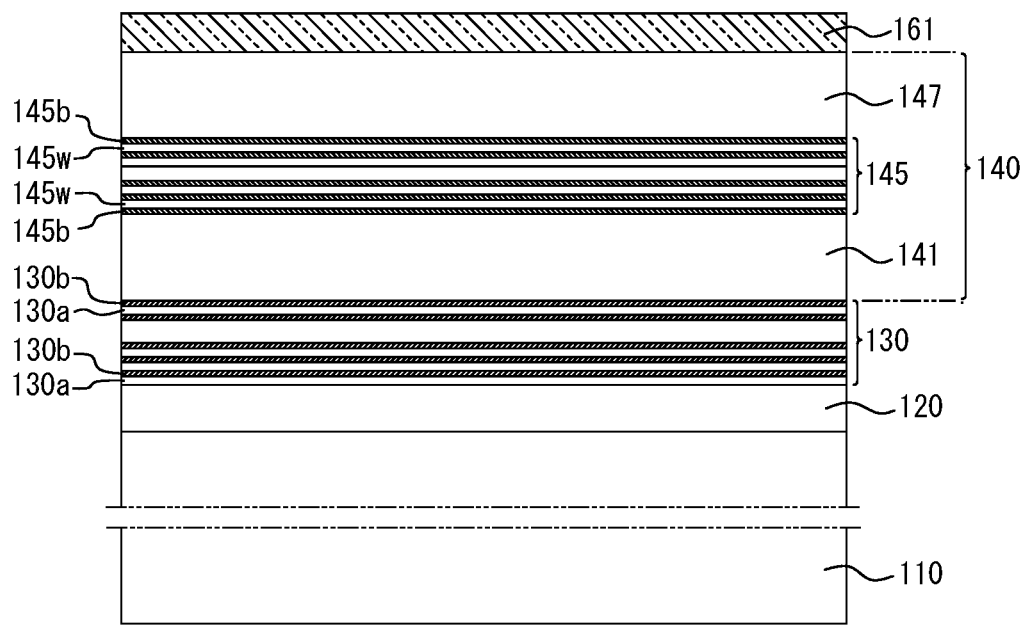
FIG. 4A is a schematic cross-sectional view illustrating the embodiment of a method of producing a semiconductor optical device according to this disclosure, subsequent to the step in FIG. 3.
Figure 4B:
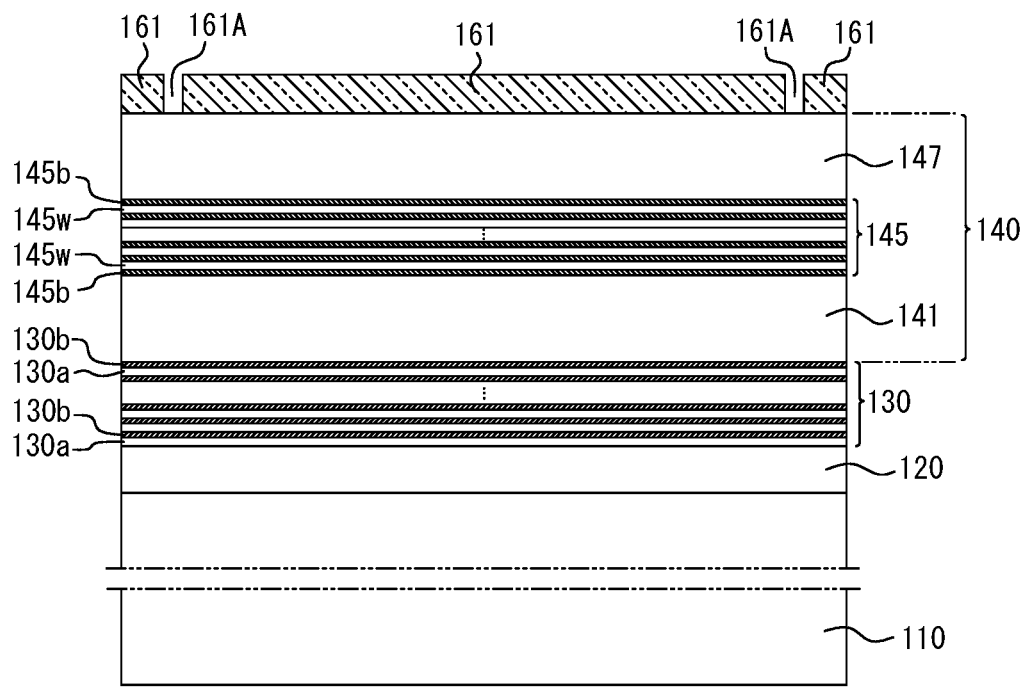
FIG. 4B is a schematic cross-sectional view illustrating the embodiment of a method of producing a semiconductor optical device according to this disclosure, subsequent to the step in FIG. 4A.
Figure 4C:
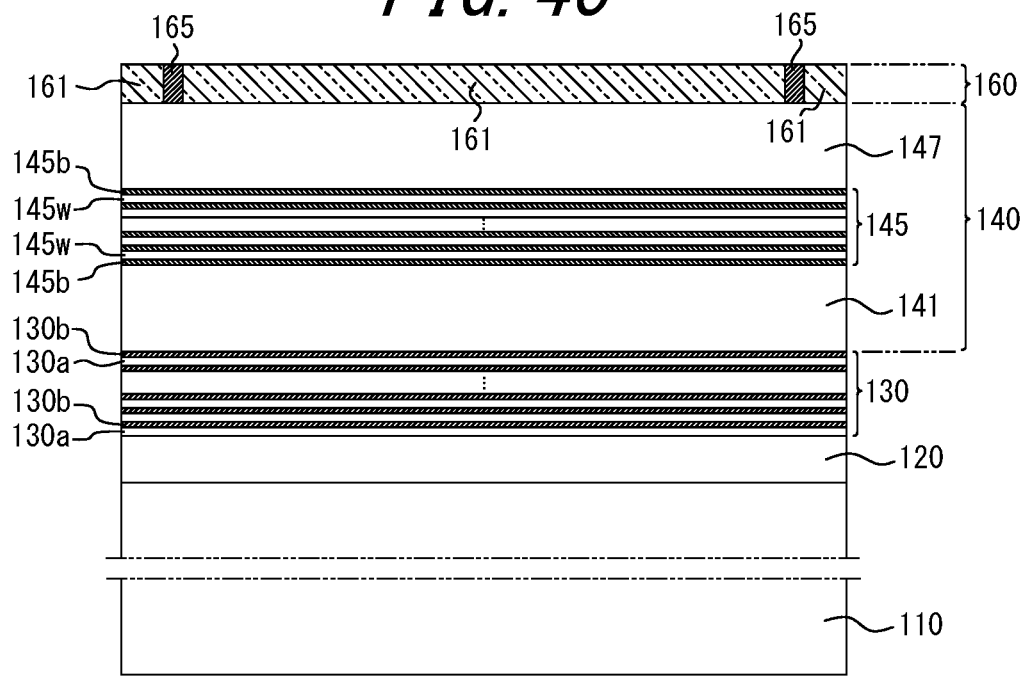
FIG. 4C is a schematic cross-sectional view illustrating the embodiment of a method of producing a semiconductor optical device according to this disclosure, subsequent to the step in FIG. 4B.

In the third step, a distribution portion 160 including a transparent insulating layer 161 having through holes 161A and ohmic electrode portions 165 provided in the through holes 161A is formed on the p-type cladding layer 147 (the contact layer in the case of providing contact layers). The distribution portion 160 may be formed by any specific technique. The order in which the steps are performed may be selected from a variety of orders. Referring to FIG. 4A, FIG. 4B, and FIG. 4C, a specific aspect of the formation of the distribution portion 160 will be described.

First, the transparent insulating layer 161 is deposited on the semiconductor laminate 140 (FIG. 4A). For the film deposition, a known technique such as plasma CVD or sputtering can be used. After that, a resist pattern is formed on the transparent insulating layer 161 using a photomask. Next, the transparent insulating layer 161 is partly removed by etching using the resist pattern to from the through holes 161A (FIG. 4B). The provision of the through holes 161A expose part of the outermost surface of the semiconductor laminate 140. After that, the ohmic electrode portions 165 are formed by deposition on a resist pattern and subsequent lift-off using the resist pattern, thus the distribution portion 160 can be formed. In the distribution portion 160, parts of the transparent insulating layer 161 and the ohmic electrode portions 165 are arranged in parallel. Note that the same resist pattern may be used in etching the transparent insulating layer 161 and in the lift-off for the ohmic electrode portions 165; alternatively, a different resist pattern may be formed. It should be noted that in the drawings, the ohmic electrode portions fill the through holes 161A for convenience; however, this is not restrictive. Although not illustrated, gaps may be formed between the transparent insulating layer 161 and the ohmic electrode portions because etching using a combination of resist patterns or a resist pattern propagates to areas covered with the resist pattern, and that is acceptable.

The ohmic electrode portions 165 can be formed into islands distributed in a predetermined pattern. For example, Au, AuZn, AuBe, AuTi, etc. can be used as the ohmic electrode portions 165, and a structure in which those materials are stacked can preferably be used as the ohmic electrode portions 165. For example, Ti/Au may be used as the ohmic electrode portions 165. The thickness (or the total thickness) of the ohmic electrode portions 165 may be for example, but not limited to 300 nm to 1300 nm, preferably 350 nm to 800 nm.

The relation between the thickness $H_1$ of the transparent insulating layer 161 and the thickness $H_2$ of the ohmic electrode portions 165 may be $H_1 \geq H_2$ and is also preferably $H_1 > H_2$. Under these conditions, the thickness of the transparent insulating layer 161 may be for example, but not limited to 360 nm to 1600 nm, more preferably 410 nm to 1100 nm. Further, it is also preferred that the difference between the thickness $H_1$ of the transparent insulating layer 161 and the thickness $H_2$ of the ohmic electrode portions 165: $H_1 - H_2$ is 10 nm or more and 100 nm or less. Moreover, when contact layers are additionally provided as described above, a contact layer may be formed to remain only in the through holes 161A, in which case, the total thickness of the contact layer and the ohmic electrode portions may be the thickness $H_2$.

Further, the transparent insulating layer 161 may use $SiO_2$, SiN, ITO, $Al_2O_3$, AlN, etc.; particularly, the transparent insulating layer 161 is preferably made of $SiO_2$. $SiO_2$ can easily be treated by etching using for example BHF.

—Metal Reflective Layer Formation Step—

Figure 4D:
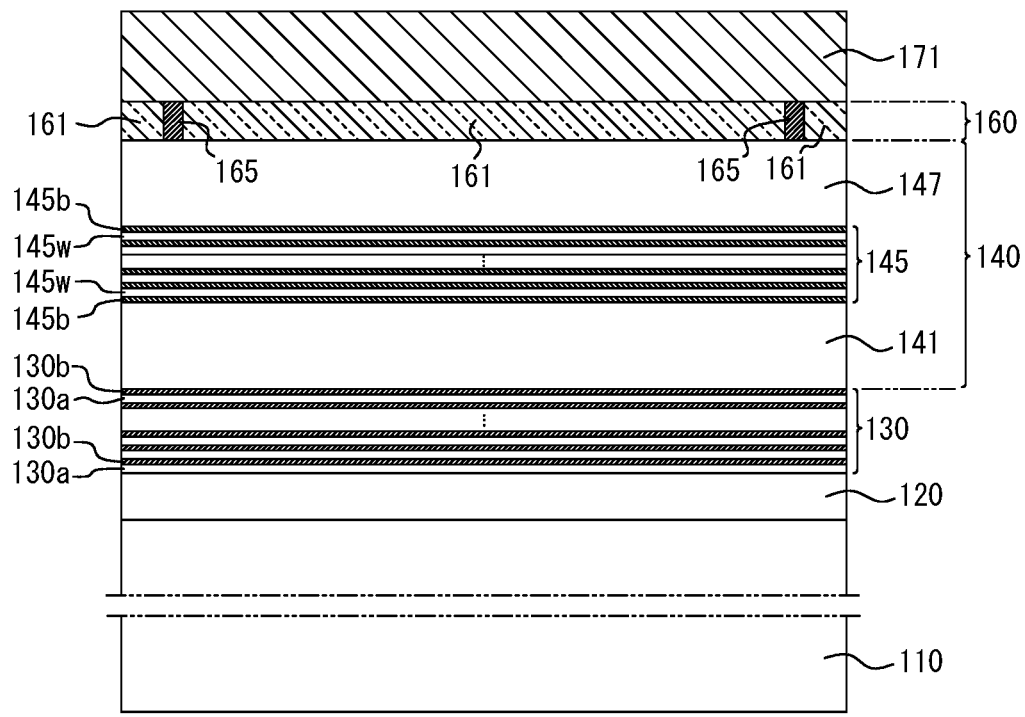
FIG. 4D is a schematic cross-sectional view illustrating the embodiment of a method of producing a semiconductor optical device according to this disclosure, subsequent to the step in FIG. 4C.

As illustrated in FIG. 4D, a metal reflective layer 171 is preferably formed on the distribution portion 160. The metal reflective layer 171 preferably contains 50% by mass or more Au in the composition of the metal reflective layer 171. More preferably, the content of Au is 80% by mass or more. The metal reflective layer 171 may include a plurality of metal layers. Other than Au; Al, Pt, Ti, Ag, etc. may be used as metals forming the reflective metal layer 171. For example, the reflective metal layer 171 may be constituted by a single layer made of Au alone; alternatively, the reflective metal layer 171 may include two or more Au metal layers. In order to ensure bonding in the subsequent fifth step, the outermost surface layer of the reflective metal layer 171 (the surface opposite to the semiconductor laminate 140) is preferably a Au metal layer.

For example, metal layers of Al, Au, Pt, and Au may be formed in this order on the distribution portion 160 (including gaps when the above gaps are formed) to form the metal reflective layer 171. The thickness of one Au metal layer in the reflective metal layer 171 may be for example 400 nm to 2000 nm, and the thickness of each metal layer made of a metal other than Au may be for example 5 nm to 200 nm. The metal reflective layer 171 can be formed by deposition using a typical technique such as vapor deposition.

<Fourth Step>

Reference is made to FIG. 5. In the fourth step, the semiconductor laminate 140 and the distribution portion 160 are bonded to the support substrate 180 with at least the metal bonding layer 179 therebetween. When the metal reflective layer 171 is provided, the metal reflective layer 171 and the metal bonding layer 179 may be bonded together.

—Metal Bonding Layer Formation Step—

Prior to the fourth step, the metal bonding layer 179 is previously formed on a surface of the support substrate 180 by sputtering, vapor deposition, etc. For example, the metal bonding layer 179 and the reflective metal layer 171 are placed to face each other and put together, followed by bonding of the layers by thermocompression bonding at a temperature of approximately 250° C. to 500° C.

«Metal Bonding Layer»

Metals such as Ti, Pt, and Au; and metals forming a eutectic alloy with gold (for example Sn) may be used to form the metal bonding layer 179. Layers of such metals are preferably stacked to form the metal bonding layer 179. For example, Ti with a thickness of 400 nm to 800 nm, Pt with a thickness of 5 nm to 20 nm, and Au with a thickness of 700 nm to 1200 nm can be stacked in this order on the surface of the support substrate 180 to form the metal bonding layer 179. Note that when the metal reflective layer 171 and the metal bonding layer 179 are bonded together, to ensure the bonding, a Au metal layer is provided as the outermost surface layer of the metal bonding layer 179, and Au is also provided as the outermost surface layer of the metal reflective layer 171 to perform bonding of Au and Au by Au—Au diffusion bonding.

«Support Substrate»

The support substrate 180 is a substrate made of a different material from the growth substrate 110; for example, a submount substrate based on a ceramic substrate of AlN etc. as well as a semiconductor substrate of Si, Ge etc. or a metal substrate of Mo, Cu—W, etc., can be used.

Since the above-described bonding process is used, the support substrate 180 is allowed to have a lattice mismatch with the semiconductor layers formed in this embodiment. Further, although the support substrate 180 may be insulating depending on use, it is preferably a conductive substrate. In terms of workability and cost, a Si substrate is preferably used as the support substrate 180. The use of a Si substrate can substantially reduce the thickness of the conductive support substrate 180 compared with that of conventional support substrates, and such a substrate is suitable for mounting in combination with various semiconductor devices. Further, a Si substrate is also more advantageous than an InAs substrate also in terms of heat dissipation.

<Fifth Step>

Reference is made to FIG. 6. In the fifth step, the InAs growth substrate 110 is removed. Note that "remove" here does not necessarily mean completely removing the InAs growth substrate 110. The InAs growth substrate 110 is tolerated to remain partly as long as the etching stop layer 130 is exposed by the "removal" in this step and the InAs growth substrate 110 can be removed together with the etching stop layer 130. The InAs growth substrate 110 may be removed using the etching stop layer 130 by etching the InAs growth substrate 110 with concentrated hydrochloric acid alone or using an etchant other than concentrated hydrochloric acid before the stage of the exposure of the etching stop layer 130. InAs can be etched using for example a hydrochloric acid-hydrogen peroxide mixture, a sulfuric acid-hydrogen peroxide mixture, etc. However, these etchants of mixed solutions cause etching of the etching stop layer 130 as well. Accordingly, etching is hardly stopped at a predetermined position using only the above mixed solutions. Thus, in the step of removing the InAs growth substrate 110, etching is preferably performed using only concentrated hydrochloric acid in the final stage of the exposure of the etching stop layer 130. Further, part of InAs may be similarly removed by a method other than wet etching, for example, machining such as dry etching or grinding. The InAs growth substrate 110 can be removed in the end by wet etching using concentrated hydrochloric acid of 8 M or higher (for example, 12 M concentrated hydrochloric acid), and etching can be stopped at least by the etching stop layer 130. Since the etching stop layer 130 is made of GaAsSb-based III-V compound semiconductors, it is not removed with concentrated hydrochloric acid. For example, the etching stop layer 130 can be removed by wet etching using an ammonia-hydrogen peroxide mixture.

«Etching Conditions»

As described above, the InAs growth substrate 110 can be wet etched using concentrated hydrochloric acid of 8 M or higher (for example, 12 M concentrated hydrochloric acid). However, the etch rate in this case is low, and the following etching conditions are preferably employed considering the productivity. For example, removing the InAs growth substrate 110 in a short period of time by increasing the etch rate by maintaining the liquid temperature of the etchant of 12 M concentrated hydrochloric acid at 35° C. or higher is preferred in terms of the productivity. Further, it is also preferred that after removing the InAs growth substrate 110 halfway using an etchant that allows for isotropic flat etching at a high etch rate (for example, a sulfuric acid-hydrogen peroxide mixture), the InAs substrate is completely removed using concentrated hydrochloric acid having etching selectivity in the final stage of the exposure of the etching stop layer 130.

—Initial Buffer Layer Removal Step and Etching Stop Layer Removal Step—

In the case where the initial buffer layer 120 is provided, the initial buffer layer 120 can be removed using etching conditions appropriate for the semiconductor composition of the layer. In the case where the initial buffer layer 120 is made of InAs, the initial buffer layer 120 is removed together with the InAs growth substrate 110. The etching stop layer 130 may then be removed (FIG. 7A).

—Electrode Formation Step—

Further, the production method may further include a step of forming a top electrode 191 on the semiconductor laminate 140 (on the n-type cladding layer 141 in FIG. 7B), and forming a bottom electrode 195 on the rear surface of the support substrate 180 as illustrated in FIG. 7B. The top electrode 191 may include a wiring portion and a pad portion. The top electrode 191 and the bottom electrode 195 can be formed by a known technique; for example, sputtering, electron-beam physical vapor deposition, resistance heating, etc. can be used.

In this embodiment, the semiconductor optical device 100 can be fabricated through the above steps.

Since the distribution portion 160 is provided in this semiconductor optical device, the current can be distributed by the top electrode 191 and the ohmic electrode portions 165. Accordingly, light emitted at positions where the emission is not blocked by the top electrode 191 is increased, which partly contributes to increasing light emission efficiency. Thus, this disclosure can improve the optical device properties. Note that the conventional techniques of using an InAs growth substrate as is as a support substrate cannot employ such a structure.

Further, light can be emitted mainly from the side opposite to the support substrate 180. On the other hand, a semiconductor light-emitting diode using a conventional InAs substrate as both a growth substrate and a support substrate does not have a reflective layer and exhibits low extraction efficiency of light emitted from a semiconductor laminate in the direction of the growth substrate. Accordingly, the semiconductor optical device 100 according to this embodiment is also useful in that the directivity of the emission of light is higher than in the case of conventional semiconductor light-emitting diodes.

Although not illustrated, the production method according to this embodiment may further include, prior to the formation of the bottom electrode 195, a grinding step of grinding the support substrate 180 to a thickness of 80 μm or more and less than 200 μm. Further, as long as the thickness of the support substrate 180 is 80 μm or more, the semiconductor optical device 100 can be reduced in size and can be sufficiently handled.

A semiconductor optical device 100 obtained by the above production method includes, as illustrated in FIG. 7B: a support substrate 180; a metal bonding layer 179 provided on a surface of the support substrate 180; a distribution portion 160 including a transparent insulating layer 161 having through holes and ohmic electrode portions 165 provided in the through holes, on the metal bonding layer 179; and a semiconductor laminate 140 in which a plurality of layers made of InAsSbP-based III-V compound semiconductors including at least In and As are stacked, on the distribution portion 160.

In the semiconductor optical device 100, the semiconductor laminate 140 preferably includes an n-type cladding layer 141, an active layer 145, and a p-type cladding layer 147 in this order. In FIG. 7B, the p-type cladding layer 147, the active layer 145, and the n-type cladding layer 141 are provided in this order from the support substrate 180 side. It is also preferred that the semiconductor laminate 140 has a double hetero structure, and the InAsSbP-based III-V compound semiconductors forming the active layer 145 preferably include at least In, As and Sb. Further, it is also preferred that the semiconductor laminate 140 has a quantum well structure having barrier layers 145b and well layers 145w, and the InAsSbP-based III-V compound semiconductors forming the barrier layers 145b preferably include at least In, As and Sb. The operating wavelength of the semiconductor optical device is preferably 3.4 µm or more.

Further, in Embodiment 1 of semiconductor light-emitting diodes, the semiconductor optical device 100 may optionally include a metal reflective layer 171, a top electrode 191, and a bottom electrode 195.

Embodiment 2: Array Device

After removing an InAs growth substrate using an etching stop layer as in Embodiment 1 above, a semiconductor laminate is partly removed by etching, thus a plurality of electrically isolated elements are formed on a support substrate. After that, electrodes of the isolated elements are connected with a protective film of a dielectric film therebetween, thus a series connection device can be formed.

A semiconductor optical device 200 that is such an array device is described with reference to FIG. 9. Corresponding features in Embodiment 1 and Embodiment 2 are denoted by reference numerals having the same last two digits, and the description will not be repeated. The semiconductor optical device 200 includes: a support substrate 280; a metal bonding layer 279 provided on a surface of the support substrate 280; a distribution portion 260 including a transparent insulating layer 261 having through holes and ohmic electrode portions 265 provided in the through holes, on the metal bonding layer 279; and a semiconductor laminate 240 in which a plurality of layers made of InAsSbP-based III-V compound semiconductors including at least In and As are stacked, on the distribution portion 260.

The metal bonding layer 279 is preferably bonded to the metal reflective layer 271. On the metal reflective layer 271, the distribution portion 260 is preferably provided with another insulating layer 262. While insulation is ensured by the protective film 297, current supply between the top electrode 291 and the ohmic electrode portions 265 allows for the series connection of the semiconductor laminate 240. In this embodiment, the support substrate 280 may be insulating. When the growth substrate is used as is as a support substrate, the conductivity and (semi) insulation property, and the lattice constant to be obtained is constrained by the kind of the growth substrate. However, the semiconductor optical device 200 is obtained by the bonding process in which an InAs growth substrate is used and removed, so that this disclosure does not suffer from those constraints and is advantageous over conventional techniques in this respect.

Embodiment 3: Semiconductor Light-Receiving Element

Further, a semiconductor light-receiving element can also be obtained using the etching stop layer as in Embodiment 1 above. A semiconductor optical device having a semiconductor laminate including for example an InAsSb light absorption layer and an InAs window layer can be used as a semiconductor light-receiving element. The operating wavelength (reception wavelength) of the device is for example 1700 nm to 12000 nm (1.7 µm to 12 µm), may be 3.1 µm or more, and is preferably 3.4 µm or more.

EXAMPLES

Example 1

The following provides a more detailed description of this disclosure using examples. However, this disclosure is not in any way limited by the following examples. A semiconductor light-emitting diode of Example 1 was fabricated in accordance with the order of steps illustrated in FIGS. 1 to 7B. The steps are as follows.

First, an undoped InAs layer (initial buffer layer) was formed to a thickness of 100 nm on the (100) plane of an undoped InAs substrate (substrate thickness: 475 µm). Next, a superlattice laminate (etching stop layer) in which 113 pairs of undoped GaSb layers (thickness: 0.9 nm) and $GaAs_{0.34}Sb_{0.66}$ layers (thickness: 0.1 nm) were stacked was formed. Subsequently, on the superlattice laminate, an n-type InAs cladding layer (thickness: 1 µm) doped with Te, an active layer having a quantum well structure with a main emission wavelength of 3800 nm (total thickness: 830 nm), and a p-type InAs cladding layer (thickness: 1 µm) doped with Zn were sequentially formed by MOCVD. Now, for the formation of the active layer having a quantum well structure, after forming $InAs_{0.15}P_{0.85}$ barrier layers (thickness: 30 nm), 20 $InAs_{0.7}Sb_{0.3}$ well layers (thickness: 10 nm) and 20 $InAs_{0.15}P_{0.85}$ barrier layers (thickness: 30 nm) were alternately stacked to form 20.5 sets of layers including the barrier layer formed first.

Figure 10A:
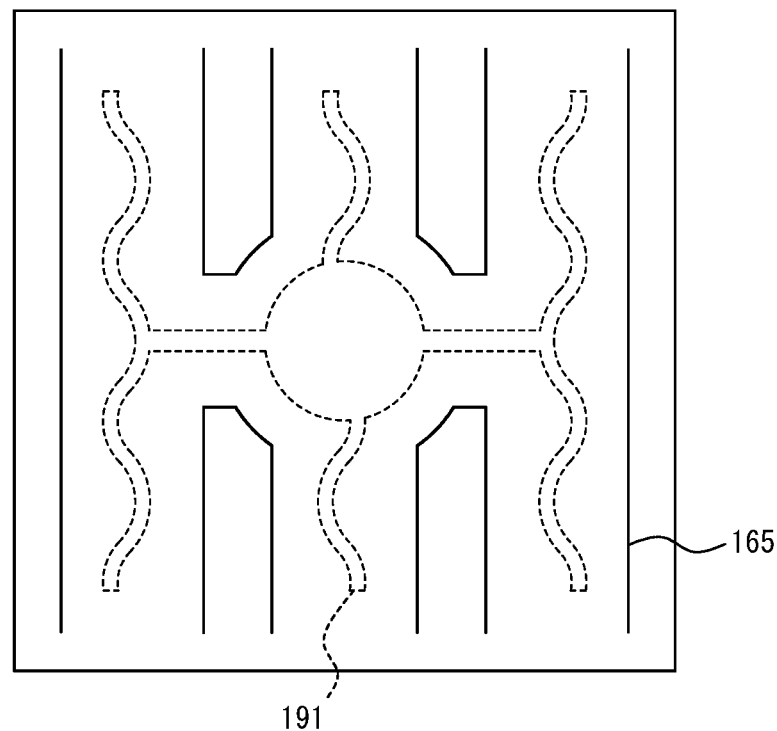
FIG. 10A is a schematic plan view illustrating the shape and the disposition of ohmic electrode portions after a distribution portion in Example 1 is fabricated.

Next, a transparent insulating layer (thickness: 550 nm) made of $SiO_2$ was formed on the entire surface of the p-type InAs cladding layer by plasma CVD. On the transparent insulating layer, a pattern depicted in FIG. 10A was formed using a resist, and $SiO_2$ was partly removed by wet etching using BHF to form through holes, thus the p-type InAs cladding layer was exposed. Subsequently, p-type ohmic electrode portions (Ti/Au, total thickness: 540 nm) was formed in the through holes by vapor deposition and lift-off of the resist pattern so that parts of the transparent insulating layer and the p-type ohmic electrode portions were formed in parallel, thus a current spreading layer (distribution portion) was formed. FIG. 10A illustrates a top electrode to be formed, by the broken line.

Next, on the entire surface of the current diffusion layer, a metal reflective layer (Al/Au/Pt/Au) was formed by vapor deposition. The thickness of the metal layers in the reflective metal layer was 10 nm, 650 nm, 100 nm, and 900 nm in this order.

On the other hand, a metal bonding layer (Ti/Pt/Au) was formed on a conductive Si substrate (substrate thickness: 200 µm) serving as a support substrate. The thickness of the metal layers in the metal bonding layer was 650 nm, 20 nm, and 900 nm in this order.

The metal reflective layer and the metal bonding layer were placed to face each other, and thermocompression bonding was performed at 300° C. At least the InAs substrate, the initial buffer layer, and the etching stop layer were then partially immersed in concentrated hydrochloric acid (produced by KANTO CHEMICAL CO., INC.) of 12 M concentration for 10.5 h in a beaker placed in a hot bath maintained at 25° C. Thus the InAs substrate and the buffer layer were removed to expose the superlattice laminate (etching stop layer) including the GaSb layers and the $GaAs_{0.34}Sb_{0.66}$ layers. Subsequently, after cleaning with pure water and drying, the superlattice laminate (etching stop layer) was removed by wet etching using an ammonia-hydrogen peroxide mixture, thus the n-type InAs cladding layer was exposed.

Figure 10B:
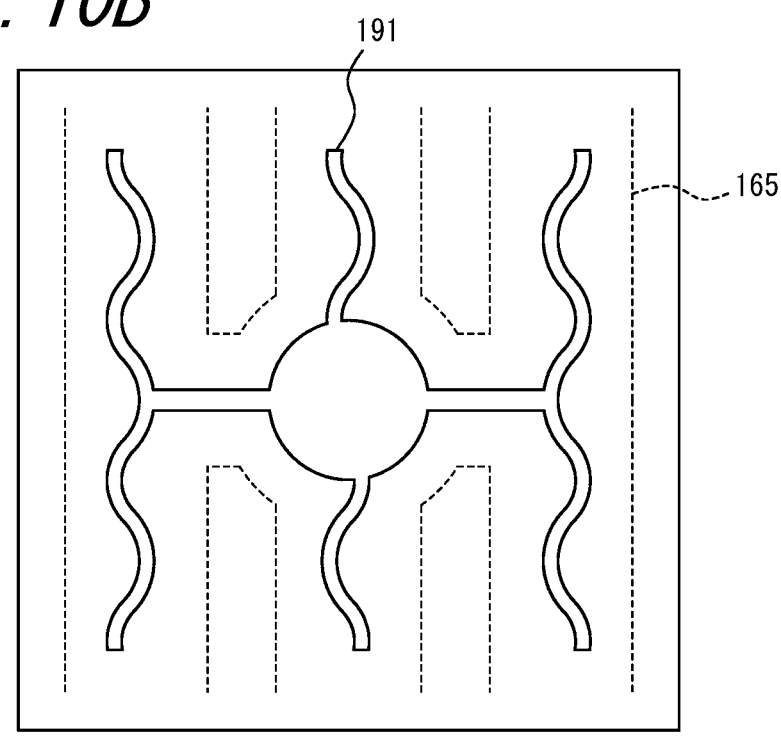
FIG. 10B is a schematic plan view illustrating the shape and the disposition of a top electrode in Example 1.

Next, on the n-type InAs cladding layer, an n-type electrode (Ti (thickness: 150 nm)/Au (thickness: 1250 nm)) was formed in a pattern depicted in FIG. 10B by forming a resist pattern, vapor depositing the n-type electrode materials, and lifting the resist pattern off. FIG. 10B illustrates the pattern of the p-type ohmic electrode portions formed in advance, by the broken line.

Finally, the semiconductor layers between elements (width: 30 μm) were removed by mesa etching to form dicing lines. A bottom electrode (Ti (thickness: 10 nm)/Pt (thickness: 50 nm)/Au (thickness: 200 nm)) was formed on the rear surface side of the Si substrate, and was alloyed by heat treatment at 300° C. for 1 min. After that, chip singulation was performed by dicing, thus a semiconductor light-emitting diode of Example 1 was completed. Note that the chip size was 500 μm×500 μm.

Comparative Example 1

A semiconductor light-emitting diode of Comparative Example 1 was fabricated as follows. First, an i-type InAs cladding layer (thickness: 100 nm) was formed as an initial buffer layer on the (100) plane of an i-type InAs substrate. Subsequently, an active layer having a quantum well structure with a main emission wavelength of 3800 nm (total thickness: 830 nm), and a p-type InAs cladding layer (thickness: 1 μm) doped with Zn were sequentially formed by MOCVD as in Example 1. A top electrode (Ti (thickness: 150 nm)/Au (thickness: 1250 nm)) was then formed on the center of the p-type InAs layer, and a bottom electrode (Ti (thickness: 10 nm)/Au (thickness: 200 nm)) was formed on the rear surface side of the i-type undoped InAs substrate, and was alloyed under the same conditions as in Example 1. Further, singulation was performed.

<Evaluation: Evaluation of Light Output>

A current of 300 mA was supplied to each of the semiconductor light-emitting diodes obtained in Example 1 and Comparative Example 1 using a constant current/voltage power supply. For each diode, the forward voltage Vf and the light output power Po then at a point were measured; the light output power Po was measured using an integrating sphere. The results are given in Table 1. Table 1 also gives WPE (=Po/($I_f V_f$); emission efficiency).

TABLE 1

| | Light output power Po (mW) | Forward voltage Vf(V) | WPE (%) |
|---|---|---|---|
| Example 1 | 0.0398 | 0.268 | 0.0495 |
| Comparative Example 1 | 0.0386 | 0.334 | 0.0385 |

In Example 1 meeting the conditions of this disclosure, the InAs growth substrate was bonded to a different support substrate with the p-type ohmic electrode portions scattered like islands and the reflective electrode therebetween, and was removed. Thus, it was found that as compared with a semiconductor light-emitting diode in which an InAs growth substrate was used as was, while the forward voltage was reduced, the light output power was increased. Further, since the reflective metal layer was used in Example 1, Example 1 is more advantageous than Comparative Example 1 in terms of achieving high directivity.

Reference Experimental Example

An etching stop layer was formed on an InAs substrate under the same conditions as in Example 1. In this state, etching tests were performed under the etching conditions given in Table 2. Under Condition (set of conditions) 3, the InAs substrate was partly etched using a mixed solution of sulfuric acid and hydrogen peroxide (piranha solution), and the InAs substrate was then etched using hydrochloric acid (concentrated hydrochloric acid). The concentration of the etchants used was 12 M for hydrochloric acid (concentrated hydrochloric acid), 18 M for sulfuric acid, 10 M for hydrogen peroxide (dioxidane), and 13 M for nitric acid. Further, the ratios in the table represents the volume ratios used to prepare the etchants. The results are given in Table 2.

Note that the substrate removal was evaluated through visual observation according to the following criteria.

⊚: Etching stop layer was exposed, and InAs substrate was removed.

○: Although side etching was observed on circumferential portion, etching stop layer was exposed, and InAs substrate was removed.

X: Etching was not stopped by etching stop layer, and semiconductor laminate was etched.

It was found that the etching selectivity of the etching stop layer could be utilized and the InAs substrate was successfully removed using concentrated hydrochloric acid in the final stage of the exposure of the etching stop layer.

TABLE 2

| | Etchant (Volume ratio of solutions) | Liquid temperature (° C.) | Treatment time (h) | Substrate removal |
|---|---|---|---|---|
| Condition 1 | Concentrated hydrochloric acid | 15-23 | 10.5 | ⊚ |
| Condition 2 | Concentrated hydrochloric acid | 37-39 | 2.26 | ○ |
| Condition 3 | Piranha solution (sulfuric acid 1:dioxidane 1:water 1)/concentrated hydrochloric acid | 22 | 6.9 (piranha solution 2.7:concentrated hydrochloric acid 4.2) | ⊚ |
| Condition 4 | Piranha solution (sulfuric acid 3:dioxidane 1:water 1)/concentrated hydrochloric acid | 37 | 27.0 | X |
| Condition 5 | Piranha solution (sulfuric acid 1:dioxidane 1:water 1)/concentrated hydrochloric acid | 22 | 3.8 | X |
| Condition 6 | Aqua regia (nitric acid 1:concentrated hydrochloric acid 1) | 18 | 0.3 | X |

INDUSTRIAL APPLICABILITY

This disclosure provides a method of producing a semiconductor optical device that makes it possible to improve the optical device properties of the semiconductor optical device including semiconductor layers containing at least In, As, and Sb. This disclosure also provides a semiconductor optical device produced by this production method.

REFERENCE SIGNS LIST

100, 200: Semiconductor optical device
110: InAs growth substrate
120: Initial buffer layer
130: Etching stop layer
130*a*: First layer
130*b*: Second layer
140: Semiconductor laminate
141: n-type cladding layer
145: Active layer
145*w*: Well layer
145*b*: Barrier layer
147: p-type cladding layer
160: Distribution portion
161: Transparent insulating layer
161A: Through hole
165: Ohmic electrode portion
171: Metal reflective layer
175: Metal bonding layer
180: Support substrate
191: Top electrode
195: Bottom electrode

The invention claimed is:

1. A method of producing a semiconductor optical device, comprising:
   a first step of forming an etching stop layer made of GaAsSb-based III-V compound semiconductors including at least Ga and Sb on an InAs growth substrate;
   a second step of forming a semiconductor laminate in which a plurality of layers made of InAsSbP-based III-V compound semiconductors including at least In and As are stacked on the etching stop layer;
   a third step of forming a distribution portion including a transparent insulating layer having a through hole and an ohmic electrode portion provided in the through hole on the semiconductor laminate;
   a fourth step of bonding the semiconductor laminate and the distribution portion to a support substrate with at least a metal bonding layer therebetween; and
   a fifth step of removing the InAs growth substrate,
   wherein InAsSbP-based III-V compound semiconductors of at least one of the layers in the semiconductor laminate include at least In, As, and Sb,
   the etching stop layer includes a superlattice laminate,
   the superlattice laminate includes first layers and second layers which are alternately stacked, and
   at least each of the first layers contain Ga, As, and Sb.

2. The method of producing a semiconductor optical device, according to claim 1, wherein the semiconductor laminate includes an n-type cladding layer, an active layer, and a p-type cladding layer in this order.

3. The method of producing a semiconductor optical device, according to claim 2, wherein the semiconductor laminate has a double heterostructure, and InAsSbP-based III-V compound semiconductors forming the active layer include at least In, As, and Sb.

4. The method of producing a semiconductor optical device, according to claim 2, wherein the semiconductor laminate has a quantum well structure including barrier layers and well layers, and InAsSbP-based III-V compound semiconductors forming the barrier layers include at least In, As, and Sb.

5. The method of producing a semiconductor optical device, according to claim 1, wherein an operating wavelength of the semiconductor optical device is 3.4 μm or more.

6. The method of producing a semiconductor optical device according to claim 1, wherein
   each of the first layers is expressed as $GaAs_{x_{E1}}Sb_{1-x_{E1}}$, wherein $0.08 \leq x_{E1} \leq 0.80$, and
   each of the second layer is expressed as $GaAs_{x_{E2}}Sb_{1-x_{E2}}$, wherein $0 \leq x_{E2} \leq 0.08$.

\* \* \* \* \*